United States Patent
Li et al.

(10) Patent No.: US 10,426,036 B2
(45) Date of Patent: *Sep. 24, 2019

(54) POWER TUBE CONNECTION STRUCTURE OF POWER AMPLIFIER AND POWER AMPLIFIER

(71) Applicant: Huawei Technologies Co., Ltd., Shenzhen (CN)

(72) Inventors: Songlin Li, Shenzhen (CN); Pengbo Tian, Xi'an (CN); Qingyun Wang, Xi'an (CN); Liang Xu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/192,018

(22) Filed: Nov. 15, 2018

(65) Prior Publication Data

US 2019/0223293 A1    Jul. 18, 2019

Related U.S. Application Data

(63) Continuation of application No. 15/676,352, filed on Aug. 14, 2017, now Pat. No. 10,165,687, which is a (Continued)

(30) Foreign Application Priority Data

Feb. 15, 2015 (CN) ..................... 2015 2 0112293 U

(51) Int. Cl.
*H03F 3/22* (2006.01)
*H05K 1/18* (2006.01)
*H05K 3/34* (2006.01)

(52) U.S. Cl.
CPC ............... *H05K 1/183* (2013.01); *H03F 3/22* (2013.01); *H05K 3/3442* (2013.01); *H05K 2201/09036* (2013.01); *H05K 2203/1178* (2013.01)

(58) Field of Classification Search
USPC ....................................................... 361/748
See application file for complete search history.

(56) References Cited

U.S. PATENT DOCUMENTS 3,933,419 A    1/1976  Romanelli
6,077,094 A    6/2000  Bock et al.
(Continued)

FOREIGN PATENT DOCUMENTS

CA    2976522 A1    8/2016
CN    1893772 A    1/2007
(Continued)

OTHER PUBLICATIONS

Schuler et al,"Der 1,3 GHz-Topfkreisoszillator," AbschluBbericht Mixed Signal Baugruppen 2005/6, pp. 1-38 (Sep. 29, 2006).

*Primary Examiner* — Andargie M Aychillhum
(74) *Attorney, Agent, or Firm* — Leydig, Voit & Mayer, Ltd.

(57) ABSTRACT

A power tube connection structure includes a substrate, a printed circuit board, and a power tube, where a through groove allowing the power tube to pass through is cut into the printed circuit board, a mounting groove is cut into the upper surface of the substrate at a location corresponding to the through groove, one end of the power tube extends through the through groove, and is welded onto a bottom face of the mounting groove, the end of the power tube that extends into the mounting groove abuts onto a side wall of the mounting groove close to an output end of the power amplifier, and a solder flux escape channel is made into the (Continued)

side wall of the mounting groove close to the output end of the power amplifier.

20 Claims, 3 Drawing Sheets

Related U.S. Application Data continuation of application No. PCT/CN2016/073380, filed on Feb. 3, 2016.

(56) References Cited

U.S. PATENT DOCUMENTS

| | | | |
|---|---|---|---|
| 6,345,991 | B1 | 2/2002 | Daoud |
| 6,380,491 | B1 | 4/2002 | Witty |
| 2006/0188702 | A1 | 8/2006 | Ishimoto |
| 2007/0001297 | A1 | 1/2007 | Higasa et al. |
| 2009/0001138 | A1 | 1/2009 | Tameerug |
| 2009/0122495 | A1 | 5/2009 | Tamura |
| 2011/0032685 | A1 | 2/2011 | Akiba et al. |
| 2012/0087097 | A1 | 4/2012 | Hong et al. |
| 2014/0022752 | A1 | 1/2014 | Wille |

FOREIGN PATENT DOCUMENTS

| | | |
|---|---|---|
| CN | 101170897 A | 4/2008 |
| CN | 101801581 A | 8/2010 |
| CN | 201821569 U | 5/2011 |
| CN | 202026567 U | 11/2011 |
| CN | 102510663 A | 6/2012 |
| CN | 103858525 A | 6/2014 |
| CN | 104112728 A | 10/2014 |
| CN | 204408283 U | 6/2015 |
| JP | S5174763 A | 6/1976 |
| JP | S5615081 A | 2/1981 |
| JP | S58162666 A | 9/1983 |
| JP | S59006865 U | 1/1984 |
| JP | S6147501 A | 3/1986 |
| JP | S64029901 U | 2/1989 |
| JP | H01103272 U | 7/1989 |
| JP | H05327168 A | 12/1993 |
| JP | 1131876 A | 2/1999 |
| JP | H1131876 A | 2/1999 |
| JP | H11330662 A | 11/1999 |
| JP | 2007012850 A | 1/2007 |
| JP | 2009123736 A | 6/2009 |
| JP | 2012191021 A | 10/2012 |
| WO | 03094587 A1 | 11/2003 |
| WO | 2014075251 A1 | 5/2014 |

POWER TUBE CONNECTION STRUCTURE OF POWER AMPLIFIER AND POWER AMPLIFIER

CROSS-REFERENCE TO RELATED APPLICATIONS

This application is a continuation of U.S. patent application Ser. No. 15/676,352, filed on Aug. 14, 2017, which is a continuation of International Application No. PCT/CN2016/073380, filed on Feb. 3, 2016, which claims priority to Chinese Patent Application No. 201520112293.2 filed on Feb. 15, 2015. All of the afore-mentioned patent applications are hereby incorporated by reference in their entireties.

TECHNICAL FIELD

The present invention relates to the field of power amplifier technologies, and in particular, to a power tube connection structure of a power amplifier and a power amplifier.

BACKGROUND

Conventional power amplifiers include two types: drop-in power amplifiers and surface mount power amplifiers. FIG. 1 is a schematic structural diagram of a drop-in power amplifier in the prior art, including a substrate 01, a printed circuit board 02 covering an upper surface of the substrate 01, and a power tube 03. A through groove 04 allowing the power tube 03 to pass through is cut into the printed circuit board 02. A mounting groove 05 is cut into the upper surface of the substrate 01 at a location that is corresponding to the through groove 04. One end of the power tube 03 extends through the through groove 04, and is welded onto a bottom face of the mounting groove 05.

To make it convenient for the power tube 03 to pass through the through groove 04 and drop in the mounting groove 05, a size of the mounting groove 05 is 0.25 mm greater than that of the power tube 03 on one side. To improve power amplification consistency, assembly design of a power amplifier requires that the power tube 03 is pushed toward a side of the mounting groove that is close to an output end of the power amplifier, to ensure that there is no gap left between the output end of the power amplifier and a side wall of the mounting groove that is close to the output end of the power amplifier. However, there is consequently no escape channel for gas solder flux during reflow soldering, and a solder void is formed at the bottom of the power tube 03.

SUMMARY

Embodiments of the present invention provide a power tube connection structure of a power amplifier and a power amplifier, to prevent a solder void at the bottom of a power tube.

To achieve the foregoing objective, according to a first aspect, an embodiment of the present invention provides a power tube connection structure of a power amplifier, including a substrate, a printed circuit board covering an upper surface of the substrate, and a power tube, where a through groove allowing the power tube to pass through is cut into the printed circuit board, a mounting groove is cut into the upper surface of the substrate at a location that is corresponding to the through groove, one end of the power tube extends through the through groove, and is welded onto a bottom face of the mounting groove, the end of the power tube that extends into the mounting groove abuts onto a side wall of the mounting groove that is close to an output end of the power amplifier, and a solder flux escape channel is made into the side wall of the mounting groove that is close to the output end of the power amplifier.

In a first possible implementation manner, with reference to the first aspect, the solder flux escape channel is a first opening made into the side wall of the mounting groove that is close to the output end of the power amplifier, and there is a gap left between an inner wall of the through groove in the printed circuit board and an outer wall of the power tube.

In a second possible implementation manner, with reference to the first aspect, the solder flux escape channel is a first opening made into the side wall of the mounting groove that is close to the output end of the power amplifier, and a second opening is made into the printed circuit board at a location that is corresponding to the first opening.

In a third possible implementation manner, according to the first or the second possible implementation manner, the power tube includes a pin laid over an upper surface of the printed circuit board, and a through hole is made into the pin at a location that is corresponding to the first opening.

In a fourth possible implementation manner, according to the first or the second possible implementation manner, the first opening is a semi-circular opening perpendicular to the bottom face of the mounting groove.

In a fifth possible implementation manner, with reference to the first aspect, a side push hole perpendicular to the bottom face of the mounting groove is made into a side wall of the mounting groove that is close to an input end.

In a sixth possible implementation manner, with reference to the first aspect, multiple protruding supports are laid in one plane on the bottom face of the mounting groove, and a height difference between the protruding supports and the bottom face of the mounting groove is 0.1-0.2 mm.

In a seventh possible implementation manner, according to the sixth possible implementation manner, there are four protruding supports, two protruding supports are laid close to the output end of the power amplifier, and the rest two protruding supports are laid close to an input end of the power amplifier.

According to the power tube connection structure of a power amplifier provided in this embodiment of the present invention, a solder flux escape channel is made into a side wall of a mounting groove that is close to an output end of a power amplifier, and during welding, gas solder flux can flow out of the power amplifier through the solder flux escape channel, preventing a solder void from forming at the bottom of a power tube.

According to a second aspect, an embodiment of the present invention provides a power amplifier, including the power tube connection structure of a power amplifier according to any one of the foregoing technical solutions.

According to the power amplifier provided in this embodiment of the present invention, a solder flux escape channel is made into a side wall of a mounting groove that is close to an output end of the power amplifier. During welding, gas solder flux can flow out of the power amplifier through the solder flux escape channel, preventing a solder void from forming at the bottom of a power tube.

BRIEF DESCRIPTION OF DRAWINGS

To describe the technical solutions in the embodiments of the present invention or in the prior art more clearly, the following briefly describes the accompanying drawings required for describing the embodiments or the prior art.

Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly and completely describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

In the descriptions of the present invention, it should be understood that, position or location relationships indicated by the terms "center", "upper", "lower", "ahead", "behind", "left", "right", "perpendicular", "horizontal", "top", "bottom", "inner", "outer", and the like are position or location relationships based on the accompanying drawings, and are merely intended for ease of describing the present invention and simplification of description, instead of indicating or implying that the apparatuses or components referred to need to be provided in a particular position or be constructed and operated in a particular position, and therefore, shall not be understood as limitations on the present invention.

The terms "first" and "second" are merely intended for a purpose of description, and shall not be understood as an indication or implication of relative importance or an implicit indication of a quantity of indicated technical features. Therefore, a feature modified by "first" or "second" may explicitly or implicitly include one or more such features. In the descriptions of the present invention, unless otherwise indicated, the meaning of "multiple" is two or more.

Figure 1:
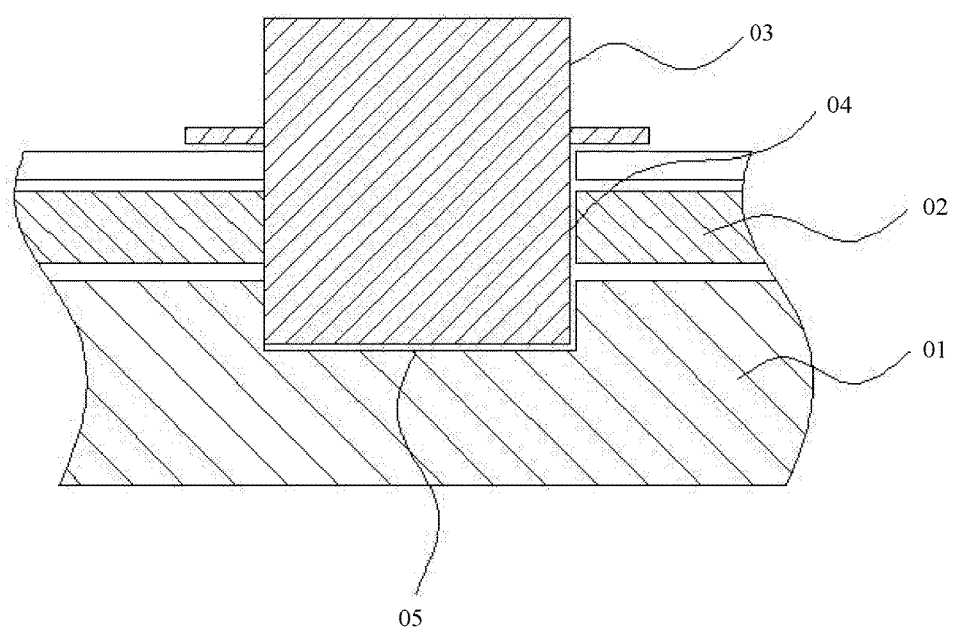
FIG. 1 is a schematic structural diagram of a drop-in power amplifier in the prior art.
Figure 2:
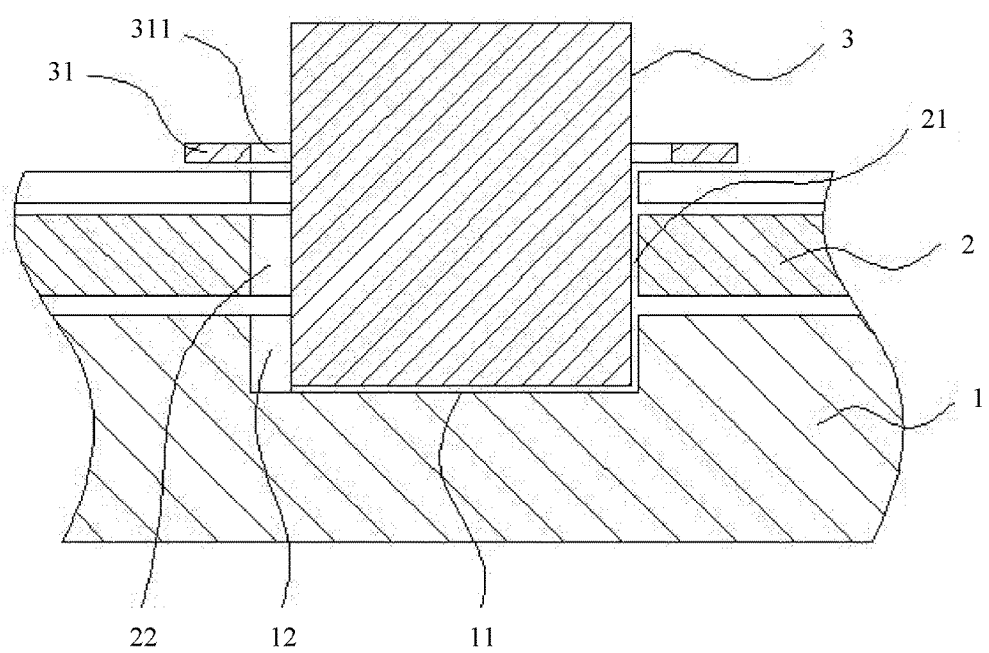
FIG. 2 is a schematic diagram of a power tube connection structure of a power amplifier according to an embodiment of the present invention.

Referring to FIG. 2, FIG. 2 shows a specific embodiment of a power tube connection structure of a power amplifier according to an embodiment of the present invention. The power tube connection structure of a power amplifier includes a substrate 1, a printed circuit board 2 covering an upper surface of the substrate 1, and a power tube 3. A through groove 21 allowing the power tube 3 to pass through is cut into the printed circuit board 2. A mounting groove 11 is cut into the upper surface of the substrate 1 at a location that is corresponding to the through groove 21. One end of the power tube 3 extends through the through groove 21, and is welded onto a bottom face of the mounting groove 11. The end of the power tube 3 that extends into the mounting groove 11 abuts onto a side wall of the mounting groove 11 that is close to an output end of the power amplifier. A solder flux escape channel 12 is made into the side wall of the mounting groove 11 that is close to the output end of the power amplifier.

According to the power tube connection structure of a power amplifier provided in this embodiment of the present invention, a solder flux escape channel 12 is made into a side wall of a mounting groove 11 that is close to an output end of the power amplifier. During welding, gas solder flux can flow out of the power amplifier through the solder flux escape channel 12, preventing a solder void from forming at the bottom of a power tube 3.

In an embodiment of the present invention, the solder flux escape channel 12 is a first opening made into the side wall of the mounting groove 11 that is close to the output end of the power amplifier. For the convenience of discharge of gas solder flux, there is a gap (not shown in the figure) left between an outer wall of the power tube 3 and an inner wall of the through groove 21 in the printed circuit board 2. Gas solder flux flows into the first opening from the bottom of the power tube 3, flows from the bottom up in the first opening and flows out from the top of the first opening, and is discharged out of the power amplifier through the gap left between the outer wall of the power tube 3 and the inner wall of the through groove 21 in the printed circuit board 2. This is convenient for discharge of the gas solder flux.

In another embodiment of the present invention, referring to FIG. 2, the solder flux escape channel 12 is a first opening made into the side wall of the mounting groove 11 that is close to the output end of the power amplifier. There is no gap left between an outer wall of the power tube 3 and an inner wall of the through groove 21 in the printed circuit board 2, but a second opening 22 is made into the printed circuit board 2 at a location that is corresponding to the first opening. In this case, gas solder flux flows sequentially from the bottom up through the first opening and the second opening 22, and is discharged out of the power amplifier from the top of the second opening 22.

Referring to FIG. 2, the power tube 3 usually includes a pin 31 laid over an upper surface of the printed circuit board 2, while the pin 31 blocks discharge of gas solder flux to a degree. In order that the gas solder flux is discharged more smoothly, a through hole 311 is made into the pin 31 at a location that is corresponding to the first opening. In this way, the blocking effect of the pin 31 on the gas solder flux is reduced, and therefore, discharge of the gas solder flux is smoother.

To reduce difficulty of processing, the first opening is a semi-circular opening perpendicular to the bottom face of the mounting groove 11. For the substrate 1, a semi-circular chamfer is usually processed by using a milling technology, and therefore, the semi-circular opening may be processed by using the same technology. This reduces processing steps and therefore reduces the difficulty of processing.

Figure 3:
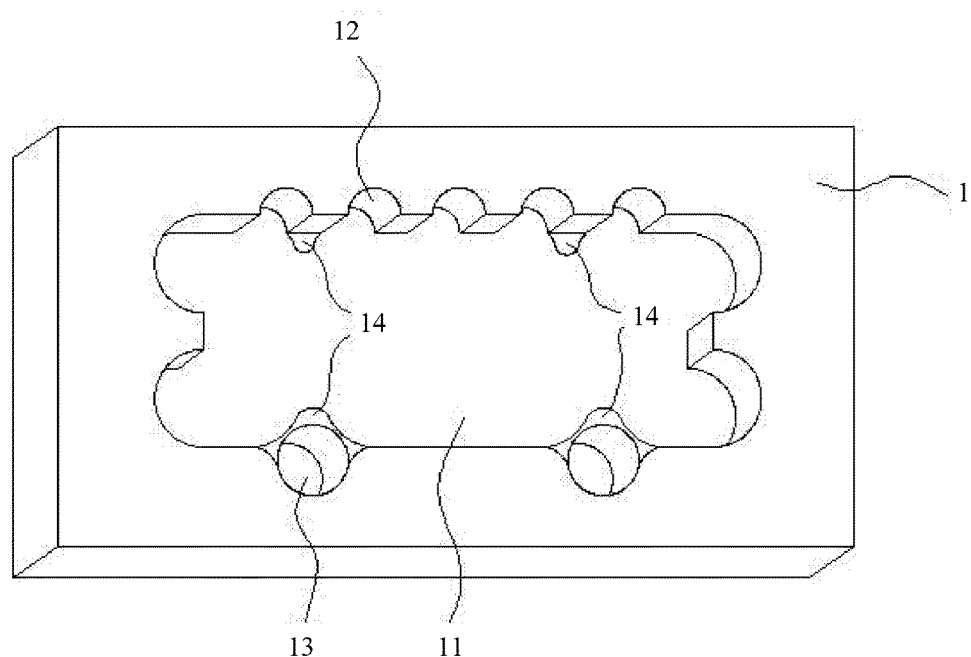
FIG. 3 is a schematic structural diagram of a substrate in a power tube connection structure of a power amplifier according to an embodiment of the present invention.

Referring to FIG. 3, to make it convenient to push the power tube 3 toward a side of the mounting groove 11 that is close to the output end of the power amplifier, a side push hole 13 perpendicular to the bottom face of the mounting groove 11 is made into a side wall of the mounting groove 11 that is close to an input end. A cylindrical pin may be inserted into the side push hole 13. As the cylindrical pin is inserted, the cylindrical pin may squeeze an edge of the power tube 3, so that the power tube 3 moves toward the side of the mounting groove 11 that is close to the output end of the power amplifier, until there is no gap left between the output end of the power amplifier and the side wall of the mounting groove 11 that is close to the output end of the power amplifier.

Different materials are used for the substrate 1 and the power tube 3 whose thermal expansion rates also vary greatly. As a result, tearing is likely to occur during welding, damaging the materials. Therefore, as shown in FIG. 3, multiple protruding supports 14 are laid in one plane on the bottom face of the mounting groove 11. A height difference between the protruding supports 14 and the bottom face of the mounting groove 11 is 0.1-0.2 mm. The protruding supports 14 provide support for the power tube 3, making room for distortion buffer between the substrate 1 and the power tube 3. This reduces the occurrence of tearing.

To improve welding precision between the substrate 1 and the power tube 3, there are four protruding supports 14. Two protruding supports 14 are laid close to the output end of the power amplifier. The rest two protruding supports 14 are laid close to an input end of the power amplifier. In this way, the power tube 3 and the substrate 1 are parallel to each other, and solder is more evenly fed during welding. Therefore, the welding precision between the substrate 1 and the power tube 3 is improved.

An embodiment of the present invention further provides a power amplifier, including the power tube connection structure of a power amplifier according to any one of the foregoing embodiments.

According to the power amplifier provided in this embodiment of the present invention, a solder flux escape channel 12 is made into a side wall of a mounting groove 11 that is close to an output end of the power amplifier. During welding, gas solder flux can flow out of the power amplifier through the solder flux escape channel 12, preventing a solder void from forming at the bottom of a power tube 3.

Other components and the like of the power amplifier in this embodiment of the present invention are well known to a person skilled in the art, and details are not described herein.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A circuit, comprising:
   a substrate;
   a printed circuit board covering an upper surface of the substrate; and
   a power tube of a power amplifier;
   wherein the printed circuit board comprises a through groove configured to allow the power tube to pass through;
   wherein the substrate comprises a mounting groove cut into the upper surface of the substrate at a location that corresponds to the through groove;
   wherein one end of the power tube extends through the through groove, is welded to a bottom face of the mounting groove, and abuts a side wall of the mounting groove; and
   wherein the mounting groove comprises a solder flux escape channel disposed in the side wall of the mounting groove.

2. The circuit according to claim 1, wherein an output end of the power amplifier is arranged against the side wall of the mounting groove.

3. The circuit according to claim 1, wherein the solder flux escape channel comprises a first opening disposed in the side wall of the mounting groove; and
   wherein there is a gap between an inner wall of the through groove in the printed circuit board and an outer wall of the power tube.

4. The circuit according to claim 3, wherein the power tube comprises a pin disposed over an upper surface of the printed circuit board, and the pin comprises a through hole at a location that corresponds to the first opening.

5. The circuit according to claim 3, wherein the first opening is a semi-circular opening perpendicular to the bottom face of the mounting groove.

6. The circuit according to claim 1, wherein the solder flux escape channel comprises a first opening disposed in the side wall of the mounting groove; and
   wherein the printed circuit board comprises a second opening at a location that corresponds to the first opening.

7. The circuit according to claim 6, wherein the power tube comprises a pin disposed over an upper surface of the printed circuit board, and the pin comprises a through hole at a location that corresponds to the first opening.

8. The circuit according to claim 6, wherein the first opening is a semi-circular opening perpendicular to the bottom face of the mounting groove.

9. The circuit according to claim 1, wherein another side wall of the mounting groove comprises a side push hole perpendicular to the bottom face of the mounting groove, wherein the another side wall of the mounting groove is next to an input end of the power amplifier.

10. The circuit according to claim 1, further comprising:
    multiple protruding supports disposed in one plane on the bottom face of the mounting groove; wherein a height difference between the protruding supports and the bottom face of the mounting groove is in the range of 0.1-0.2 mm.

11. The circuit according to claim 10, wherein the multiple protruding supports comprise four protruding supports, wherein two protruding supports of the four protruding supports are disposed at a location corresponding to an output end of the power amplifier, and the other two protruding supports of the four protruding supports are disposed at a location corresponding to an input end of the power amplifier.

12. An apparatus comprising circuitry, the circuitry comprising:
    a substrate;
    a printed circuit board covering an upper surface of the substrate; and
    a power tube of a power amplifier;
    wherein the printed circuit board comprises a through groove configured to allow the power tube to pass through;
    wherein the substrate comprises a mounting groove cut into the upper surface of the substrate at a location that corresponds to the through groove;
    wherein one end of the power tube extends through the through groove, is welded to a bottom face of the mounting groove, and abuts a side wall of the mounting groove; and
    wherein the mounting groove comprises a solder flux escape channel disposed in the side wall of the mounting groove.

13. The apparatus according to claim 12, wherein the side wall of the mounting groove is next to an output end of the power amplifier.

14. The apparatus according to claim 12, wherein the solder flux escape channel comprises a first opening disposed in the side wall of the mounting groove; and
    wherein there is a gap between an inner wall of the through groove in the printed circuit board and an outer wall of the power tube.

15. The apparatus according to claim 14, wherein the power tube comprises a pin disposed over an upper surface of the printed circuit board, and the pin comprises a through hole at a location that corresponds to the first opening.

16. The apparatus according to claim 14, wherein the first opening is a semi-circular opening perpendicular to the bottom face of the mounting groove.

17. The apparatus according to claim 12, wherein the solder flux escape channel comprises a first opening disposed in the side wall of the mounting groove; and wherein the printed circuit board comprises a second opening at a location that corresponds to the first opening.

18. The apparatus according to claim 17, wherein the power tube comprises a pin disposed over an upper surface of the printed circuit board, and the pin comprises a through hole at a location that corresponds to the first opening.

19. The apparatus according to claim 17, wherein the first opening is a semi-circular opening perpendicular to the bottom face of the mounting groove.

20. The apparatus according to claim 12, wherein another side wall of the mounting groove comprises a side push hole perpendicular to the bottom face of the mounting groove, wherein the another side wall of the mounting groove is next to an input end of the power amplifier.

* * * * *